United States Patent
Forster et al.

(10) Patent No.: US 9,531,035 B2
(45) Date of Patent: *Dec. 27, 2016

(54) LITHIUM BATTERY, METHOD FOR MANUFACTURING A LITHIUM BATTERY, INTEGRATED CIRCUIT AND METHOD OF MANUFACTURING AN INTEGRATED CIRCUIT

(71) Applicant: Infineon Technologies Austria AG, Villach (AT)

(72) Inventors: Magdalena Forster, Villach (AT); Katharina Schmut, Villach (AT); Bernhard Goller, Villach (AT); Guenter Zieger, Villach (AT); Michael Sorger, Villach (AT); Philemon Schweizer, Feffernitz (AT); Michael Sternad, Graz (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 15/040,085

(22) Filed: Feb. 10, 2016

(65) Prior Publication Data

US 2016/0164134 A1 Jun. 9, 2016

Related U.S. Application Data

(63) Continuation of application No. 14/308,125, filed on Jun. 18, 2014, now Pat. No. 9,269,961, which is a continuation of application No. 13/300,732, filed on Nov. 21, 2011, now Pat. No. 8,785,034.

(51) Int. Cl.
*H01M 10/0525* (2010.01)
*H01M 10/04* (2006.01)
(Continued)

(52) U.S. Cl.
CPC .......... *H01M 10/0525* (2013.01); *H01L 27/06* (2013.01); *H01M 4/386* (2013.01); *H01M 4/66* (2013.01); *H01M 4/70* (2013.01); *H01M 10/049* (2013.01); *H01M 10/0436* (2013.01); *H01M 10/052* (2013.01); *H01M 10/0585* (2013.01); *H01L 2224/48091* (2013.01); *H01L 2224/48472* (2013.01); *H01L 2924/1461* (2013.01); *H01M 6/40* (2013.01); *H01M 10/425* (2013.01); *H01M 2220/30* (2013.01); *H01M 2250/30* (2013.01);
(Continued)

(58) Field of Classification Search
None
See application file for complete search history.

(56) References Cited

U.S. PATENT DOCUMENTS

| 7,618,678 B2 | 11/2009 | Mao et al. |
| 8,785,034 B2 | 7/2014 | Forster et al. |

(Continued)

FOREIGN PATENT DOCUMENTS

| CN | 1714463 A | 12/2005 |
| CN | 1853297 A | 10/2006 |

(Continued)

*Primary Examiner* — Tracy Dove
(74) *Attorney, Agent, or Firm* — Murphy, Bilak & Homiller, PLLC

(57) ABSTRACT

A lithium battery includes a cathode, an anode integrally formed within a silicon substrate, wherein a surface portion of the silicon substrate is patterned to form a plurality of sub-structures, and an electrolyte.

18 Claims, 12 Drawing Sheets

(51) Int. Cl.
  *H01M 10/052* (2010.01)
  *H01M 10/0585* (2010.01)
  *H01L 27/06* (2006.01)
  *H01M 4/70* (2006.01)
  *H01M 4/38* (2006.01)
  *H01M 4/66* (2006.01)
  *H01M 10/42* (2006.01)
  *H01M 6/40* (2006.01)

(52) U.S. Cl.
  CPC ............... *Y02B 90/18* (2013.01); *Y02E 60/122* (2013.01); *Y02P 70/54* (2015.11); *Y10T 29/49108* (2015.01); *Y10T 29/49115* (2015.01)

(56) References Cited

U.S. PATENT DOCUMENTS

| | | |
|---|---|---|
| 2007/0212603 A1 | 9/2007 | Nathan et al. |
| 2007/0275300 A1 | 11/2007 | Salot et al. |
| 2011/0111304 A1 | 5/2011 | Cui et al. |

FOREIGN PATENT DOCUMENTS

| | | |
|---|---|---|
| JP | 2007317663 A | 12/2007 |
| JP | 2009530765 A | 8/2009 |
| JP | 2009545845 A | 12/2009 |
| KR | 20060084436 A | 7/2006 |
| KR | 20100032059 A | 3/2010 |
| WO | 2008015593 A2 | 2/2008 |

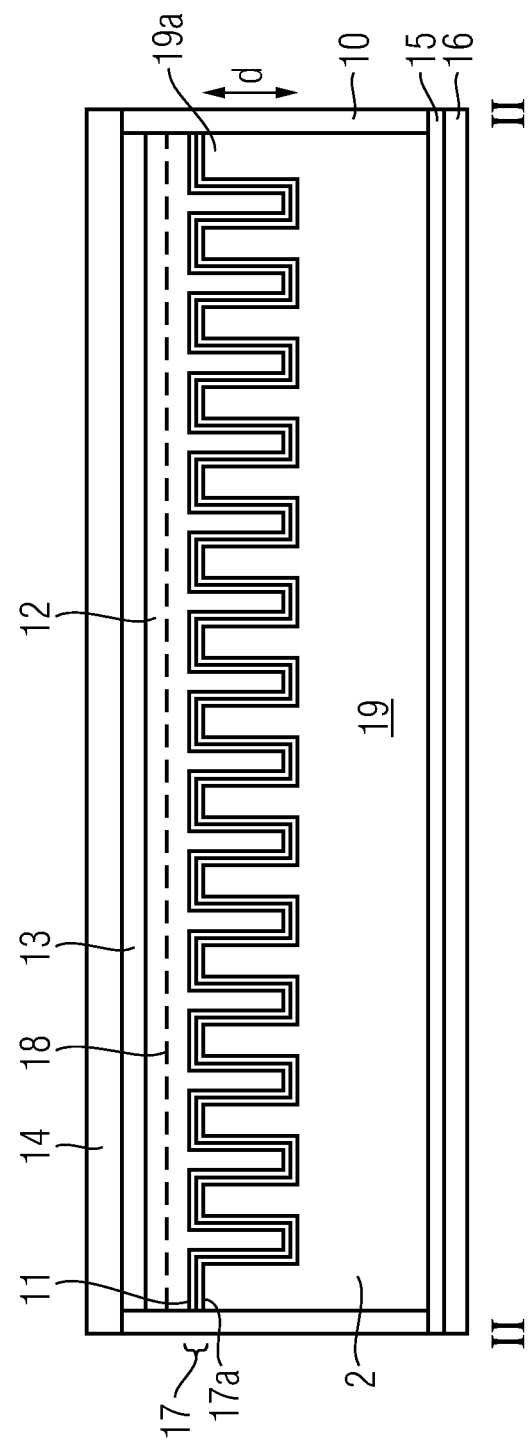

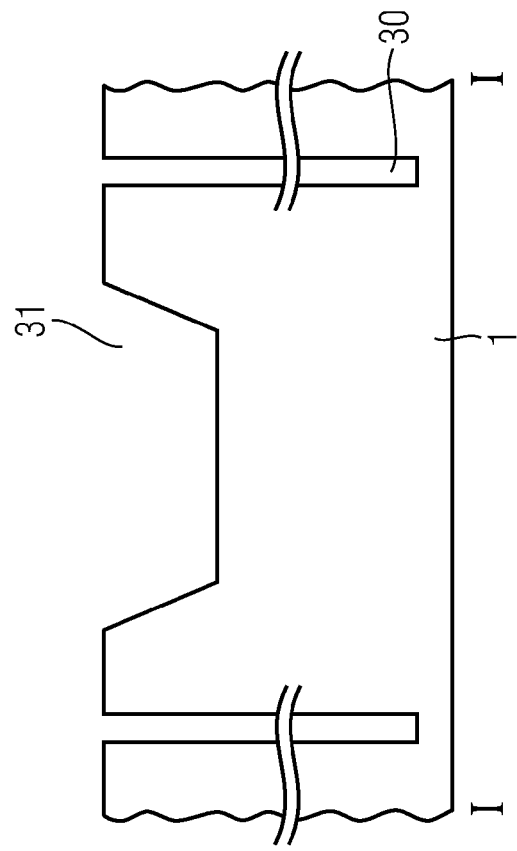
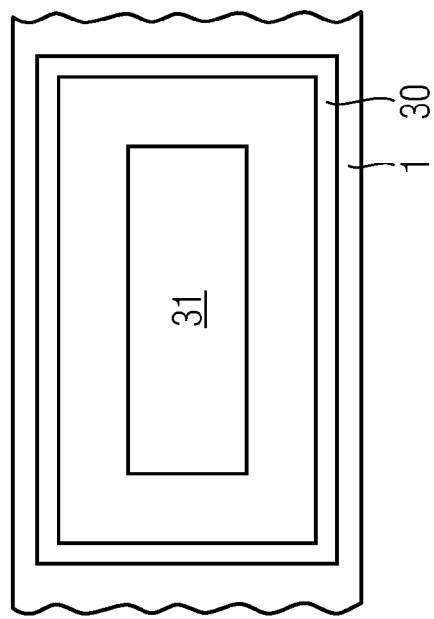
FIG 7A
FIG 7B

LITHIUM BATTERY, METHOD FOR MANUFACTURING A LITHIUM BATTERY, INTEGRATED CIRCUIT AND METHOD OF MANUFACTURING AN INTEGRATED CIRCUIT

This application is a continuation of U.S. patent application Ser. No. 14/308,125 filed 18 Jun. 2014, which in turn is a continuation of U.S. patent application Ser. No. 13/300,732 filed 21 Nov. 2011 (now U.S. Pat. No. 8,785,034), the content of said applications incorporated herein by reference in their entirety.

BACKGROUND

With the increased use of portable electronic devices such as notebooks, portable telephones, cameras and others and with the increased use of current-driven automobiles, lithium ion secondary batteries with high energy density have received increasing attention as a power source for these devices.

Conventionally, lithium ion secondary batteries comprise a positive electrode comprising a lithium-containing transition metal oxide or the like, a negative electrode comprising a carbon material, and a non-aqueous electrolyte as well as a separator which is disposed between the positive and the negative electrode.

In order to meet the increasing demands on capacity and performance, it is desirable to develop new anode materials, so that the energy storage capacity of the battery can be increased and the resulting lithium battery can be manufactured in a simple manner.

Further, integrated circuits or electronic devices requiring a relatively low amount of electrical energy are increasingly used in many applications. It would be desirable to provide a miniaturized battery that supplies these integrated circuits or electronic devices with energy.

SUMMARY

According to an embodiment of a lithium battery, the lithium battery comprises a cathode, an anode comprising a component made of silicon, a separator element disposed between the cathode and the anode, an electrolyte, and a substrate. The anode is disposed over the substrate or the anode is integrally formed with the substrate.

According to an embodiment of a method of manufacturing a lithium battery, the method comprises: forming an anode on a surface of a substrate; forming a separator element; forming a cathode so that the separator element is disposed between the cathode and the anode; and filling an electrolyte in a space formed by the anode, the cathode and the substrate.

According to an embodiment of an integrated circuit, the integrated circuit comprises a circuit element formed in a semiconductor substrate and a lithium battery. The lithium battery comprises an anode comprising a component made of silicon and a substrate. The lithium battery is formed in the substrate or in a layer over the substrate.

According to an embodiment of a method of manufacturing an integrated circuit, the method comprises: forming a circuit element in a semiconductor substrate; and forming a lithium battery. The lithium battery is formed by forming an anode on a surface of the semiconductor substrate or in a semiconductor layer over the semiconductor substrate.

According to another embodiment of a method of manufacturing a lithium battery, the method comprises: forming a circuit element in a first semiconductor substrate; forming a lithium battery by forming an anode on a surface of a second semiconductor substrate; and packaging the first semiconductor substrate and the second semiconductor substrate in a common housing.

According to an embodiment of an electronic device, the electronic device comprises an electric circuit and a lithium battery. The lithium battery comprises a cathode, an anode comprising a component made of silicon, a separator element disposed between the cathode and the anode, an electrolyte, and a substrate. The anode is disposed over the substrate or integrally formed with the substrate.

According to another embodiment of an electronic device, the electronic device comprises an electric circuit and an integrated circuit. The integrated circuit comprises a circuit element formed in a semiconductor substrate and a lithium battery. The lithium battery comprises an anode comprising a component made of silicon and a semiconductor substrate. The lithium battery is formed in the semiconductor substrate or in a layer over the semiconductor substrate.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1B shows a cross-sectional view of a lithium battery according to an alternative embodiment;

FIGS. 7A and 7B illustrate a cross-sectional view and a top view of a carrier after forming a groove in the carrier;

DETAILED DESCRIPTION

In the following detailed description reference is made to the accompanying drawings, illustrating specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The terms "carrier" or "semiconductor carrier" used in the following description may include any semiconductor-based structure that has a semiconductor surface. Carrier and structure are to be understood to include silicon, silicon on insulator (SOI) silicon-on-sapphire (SoS), doped and undoped semiconductors, epitaxial layers of silicon supported by a base semiconductor foundation, and other semiconductor structures. Further, the term "carrier" or "semiconductor carrier" further comprises any kind of semiconductor layer, which may be crystalline, polycrystalline or amorphous, which is formed on a suitable substrate material. In addition, the carrier may comprise an insulator. Specific examples comprise glass such as quartz glass ($SiO_2$), ceramics or polymers. Further, the term "substrate" may as well include any semiconductor-based structure that has a semiconductor surface. The semiconductor need not be silicon-based. The semiconductor could as well be silicon carbide, silicon-germanium, germanium, germanium or gallium arsenide. The substrate may comprise a semiconductor or an insulator. Specific examples comprise glass such as quartz glass ($SiO_2$), ceramics or polymers.

The terms "connected" or "interconnection" as used within the context of the present specification mean that the respective components may be in signal connection to each other. For example, further elements may be disposed between the components. Further, the respective components need not be physically connected as long as signals may be exchanged between them. Moreover, the terms "connected" and "interconnection" also encompass the case in which, for example, a voltage is not applied.

Figure 1A:
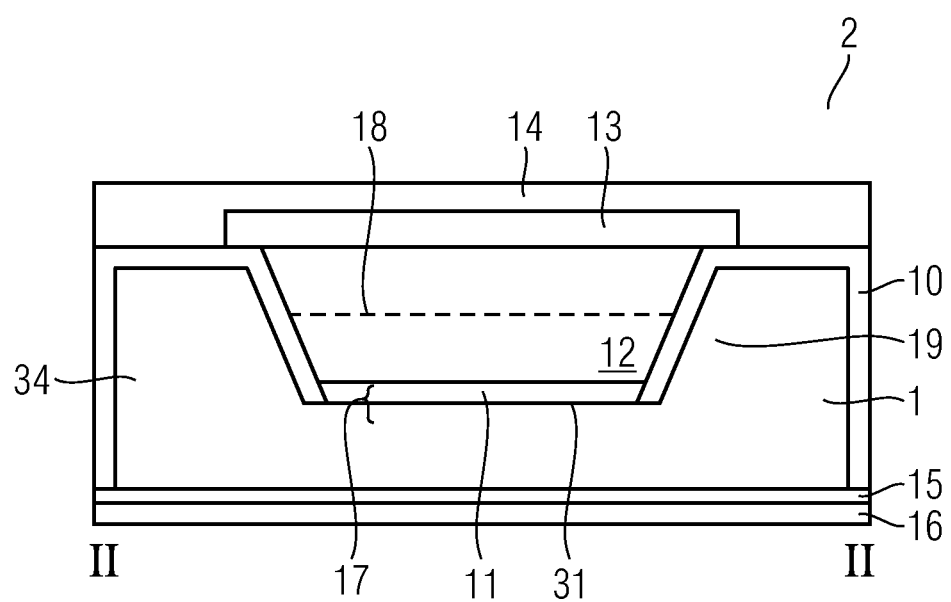
FIG. 1A shows a cross-sectional view of a lithium battery.
Figure 6B:
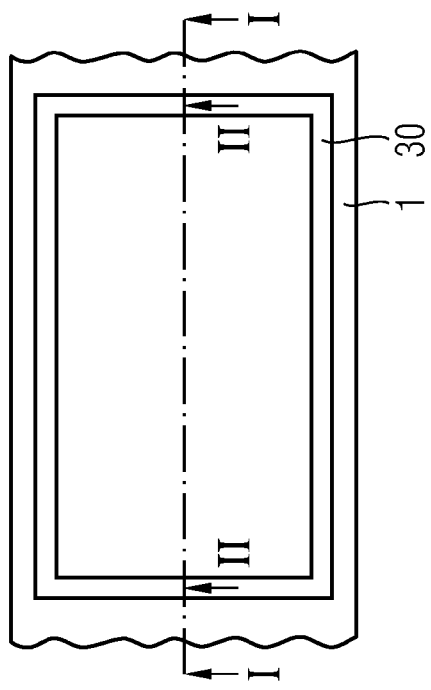
FIGS. 6A and 6B show a cross-sectional view and a top view of a carrier when performing a method of manufacturing a lithium battery.

FIG. 1A shows a cross-sectional view of an example of a lithium battery 2. The cross-sectional view is taken between II and II as is shown in FIG. 6B.

The lithium battery shown in FIG. 1A comprises a cathode 13, an anode 17 comprising a component made of silicon, a separator element 18 disposed between the cathode 13 and the anode 17, an electrolyte 12, and a substrate 19, the anode 17 being disposed over the substrate 19. For example, the anode 17 may be integrally formed with the substrate 19. Alternatively, the anode 17 may be an additional layer that is formed over the substrate 19. The anode 17, the separator element 18 and the electrolyte 12 may be arranged in a groove 31 that is disposed in the silicon body 1. For example, the anode 17 may form a wall of the groove 31. The groove 31 may comprise side walls and a bottom side and the anode 17 may form the bottom side of the groove 31. The anode 17 may further comprise a thin metal layer 11.

The substrate 19 may be made of any material as described above. The substrate 19 may be patterned. Accordingly, as is shown in FIG. 1A, a groove 31 may be formed in the substrate 19. The anode 17 may comprise silicon material which may be monocrystalline, polycrystalline or amorphous. The silicon material may be doped with any dopant as is conventionally used such as boron (B), arsenic (As), phosphorus (P) or antimony (Sb). The active silicon surface of the anode 17 may be planar or may be patterned. For example, three-dimensional structures such as pyramids, trenches and columns may be formed in the surface of the anode. A thin metal layer 11 may be formed over the surface of the anode 17 that contacts the electrolyte 12. For example, the metal layer 11 may comprise silver (Ag), aluminum (Al), gold (Au), palladium (Pd) or platinum (Pt). Metals, that form an alloy with lithium, may be used. Further examples comprise Zn, Cd, Hg, B, Ga, In, Th, C, Si, Ge, Sn, Pb, As, Sb, Bi, Se, and Te. A thickness of the metal layer 11 may be less than 100 nm and, for example, more than 1 nm. For example, Ag forms an alloy with Li at a voltage of approximately 500 mV, whereas Si forms an alloy at a voltage of approximately 330 mV. Therefore, when applying an Ag-metal layer, an Ag—Li alloy will be formed at the surface of the anode 17 before charging the Si material with lithium so that the Li ions will move to the Si anode in a homogeneous manner. Further, due to the alloy layer, the formation of the native $SiO_2$ layer on the anode surface is prevented so that the transportation of ions is further enhanced. In addition, the insertion of Li atoms in the Si anode will be accomplished in a more homogeneous manner so that the performance of the lithium battery will be improved. Moreover, due to the presence of the thin metal layer the mechanical stability of the electrode during charging and discharging is enhanced.

It has been observed that the charging time will be increased during the first charging cycle. This may be due to the thin metal layer 11 which is present on the surface of the anode 17. Nevertheless, after a number of charging cycles, the charging velocity will be equal to the case of employing an anode without a metal layer.

For the cathode 13, generally known electrical materials that are used in lithium ion batteries may be employed. Examples comprise $LiCoO_2$, $LiNiO_2$, $LiNi_{1-x}Co_xO_2$, $LiNi_{0.85}CO_{0.1}Al_{0.05}O_2$, $LiNi_{0.33}Co_{0.33}Mn_{0.33}O_2$, $LiMn_2O_4$ spinel and $LiFePO_4$. The electrolyte 12 may include electrolytes commonly used for lithium batteries such as salts such as e.g. $LiPF_6$, $LiBF_4$ in water-free aprotic solvents such as propylene carbonate, dimethylcarbonate or 1,2-dimethoxymethane, ethylene carbonate, diethyl carbonate and others, polymers, for example polyvinylidenefluoride (PVDF) or polyvinylidenefluoride hexafluorpropene (PVDF-HFP) or other polymers, $Li_3PO_4N$ and others.

The separator 18 spatially and electrically separates the anode 17 and the cathode 13 from each other. Nevertheless, the separator 18 must be permeable for the ions so that a conversion of the stored chemical energy into electrical energy may be accomplished. Examples of the material of the separator 18 comprise non-woven fabric made of materials such as fiberglass, polyethylene or micro porous materials. Further, membranes which are made of microporous sheet that may comprise several layers may be employed. Further examples comprise non-woven fabric which is coated with a ceramic material. Further examples are well known in the art.

A sealant 14 may be formed over the cathode 13. The sealant 14 provides a water and airtight capsulation. Examples of the material of the sealant 14 comprise well-known polymers e.g. polyimide. A passivation layer 10 is formed over those parts of the silicon body 1 which do not form the anode 17. To be more specific, the side walls of the groove 31 are covered with a passivation layer 10. Further, the outside of the substrate 19 or the housing of the battery is covered with the passivation layer 10. The passivation layer 10 may comprise different materials such as silicon oxide ($SiO_2$), silicon nitride ($Si_3N_4$), polymers, imids, spin-on-glass (SOG), polyethylene, metals or any combination of these materials, for example a layered structure of polymers and metals. The passivation layer 10 prevents a diffusion of lithium atoms to neighboring components.

Conductive layers 15, 16 are formed on the back side of the battery 2. For example, a metal layer 16 such as copper may be formed on the back side, an interface layer 15 such as TiW being disposed between the anode material 17 and the copper layer 16. For example, the thickness of the interface layer 15 may be in the range of 50 to 150 nm, for example, 100 nm. Further, the thickness of the copper layer 16 may be more than 500 nm, for example 1 µm or more. Alternatively, the current may as well be discharged using a buried layer or channel, for example made of polysilicon or doped silicon.

The battery 2 may be a rechargeable or secondary lithium ion battery. According to a further embodiment, the battery 2 may be a primary battery which is not rechargeable.

The battery 2 shown in FIG. 1A has an improved capacity for energy storage, since silicon has a large capacity of insertion of lithium. In other words, the amount of lithium atoms that can be stored or inserted in silicon is much larger than in conventional cases. Since the anode 17 comprises silicon, silicon or general semiconductor processing methods may be employed. In particular, methods for manufacturing miniaturized sizes can effectively be applied for manufacturing a battery having a small size in comparison to conventional batteries. According to embodiments, the packaging comprises materials that are known from semiconductor processing such as glass or mold compound. According to further embodiments, the anode 17 is integrated with the substrate 19. In these cases, also semiconductor processing methods may be employed in order to further miniaturize the battery 2. According to known semiconductor processing methods, small-sized structures may be formed so that a faster, more homogeneous, and more efficient insertion of lithium in the silicon material can be achieved. Additionally, a higher mechanical long term stability is given. Further, it is possible to integrate additional components into a single die comprising the lithium battery.

As is shown in FIG. 1A, the anode 17 is disposed in a groove 31 formed in the silicon body 1. Optionally, the anode 17 further comprises a three-dimensional surface structure so that the active surface of the anode 17 is increased. Thereby, detrimental effects of an increase of the volume of silicon due to the lithiation can be prevented. Moreover, due to the presence of the separator 18, the increase of the volume of silicon is buffered, so that the mechanical stress due to the lithiation is reduced. In the structure shown in FIG. 1A, the substrate 19 forms the housing 34 of the battery 2. According to an embodiment, the anode 17 may be integrally formed with the substrate 19 and the housing 34.

FIG. 1B shows a cross-sectional view of a further example of a lithium battery 2. The cross-sectional view may be taken between II and II as is shown in FIG. 3B, for example.

The lithium battery 2 shown in FIG. 1B comprises a cathode 13, an anode 17 comprising a component made of silicon, a separator element 18 disposed between the cathode 13 and the anode 17, an electrolyte 12, that are formed on a substrate 19. The substrate 19 may be patterned. For example, a plurality of grooves or columns may be formed in the substrate 19. For example, the grooves or columns may be formed by etching. Alternatively, the grooves or columns may be selectively grown over a planar surface so as to form extending portions 19a. The extending portions 19a may have a depth d with respect to a planar surface of the substrate 19, wherein the depth d is 20 to 100 µm. The substrate 19 may be made of any substrate material as mentioned above. The grooves or columns need not have a rectangular cross-sectional shape.

According to embodiments, also different shapes such as pyramids or others may be employed.

The anode 17 may comprise a semiconductor layer 17a, which may comprise any of the semiconductor materials as described above. The anode 17 may be formed as a layer over the surface of the substrate 19. For example, in the battery portion of the substrate 19, the semiconductor layer 17a forming the anode 17 covers the entire surface of the substrate 19. Nevertheless, as is clearly to be understood, according to a further embodiment, the substrate 19 may be a semiconductor substrate and the surface portion of the substrate 19 forms the anode 17 of the resulting battery 2. In a similar manner as has been explained above, a thin metal layer 11 may be formed over the surface of the anode 17 that contacts the electrolyte 12. The materials of the metal layer 11 may be selected from the materials described above. A thickness of the metal layer 11 may be less than 100 nm, for example, more than 1 nm. The remaining components of the battery 2 shown in FIG. 1B may be the same as that of the battery shown in FIG. 1A. The passivation layer 10 is formed on the sidewall portions of the substrate 19 and the battery 2. The cathode 13 is formed over the separator 18 so as to enclose the electrolyte 12. A sealant 14 may be formed over the cathode 13 as has been explained above.

Figure 2A:
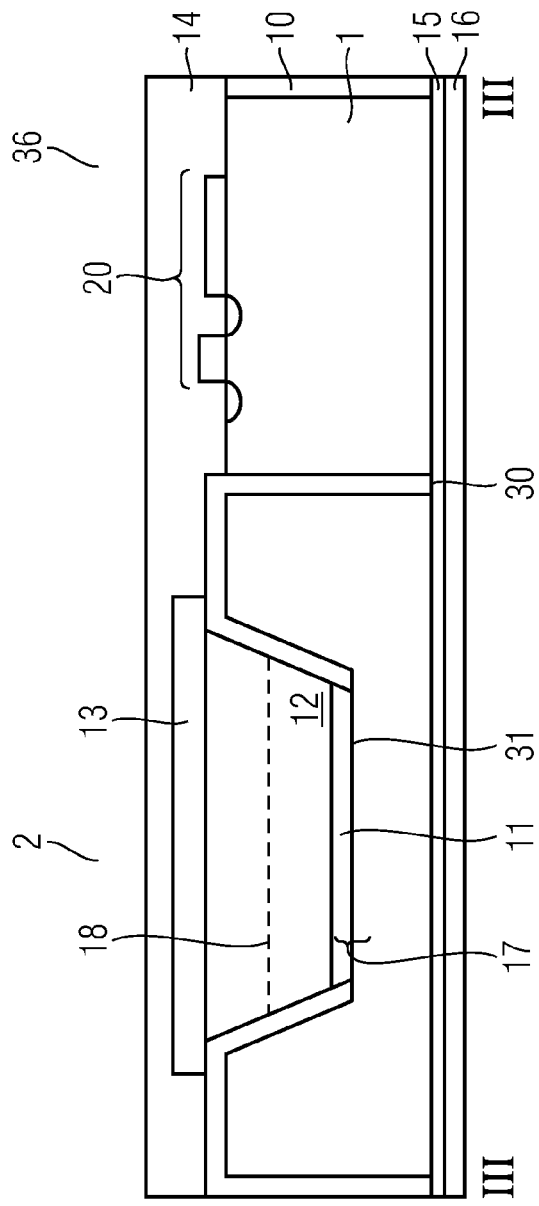
FIG. 2A shows a cross-sectional view of an integrated circuit comprising a lithium battery.
Figure 2B:
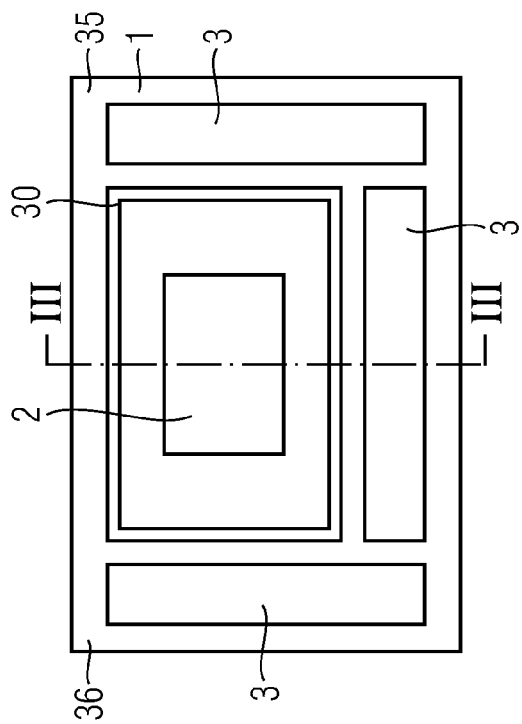
FIG. 2B shows a top view of an integrated circuit comprising a lithium battery.

FIGS. 2A and 2B show an integrated circuit 36 including a battery 2 and circuit elements 20. The cross-sectional view of FIG. 2A is taken between III and III as is shown in FIG. 2B. In FIG. 2A, the battery 2 may have a structure similar as the structure shown in FIGS. 1A and 1B. Further, the circuit elements 20 may be formed in or on a semiconductor substrate 1. For example, the circuit elements 20 may comprise transistors, resistors, capacitors, MEMS (micro-electro-mechanical system) devices, sensors, energy harvesters, for example, devices which derive energy from external sources (e.g. solar power, thermal energy, wind energy, salinity gradients and kinetic energy), a device for receiving energy, a device for converting energy such as a solar cell, for example, a device for emitting energy such as RFIDs (radio frequency identification devices), a display device, a video device or an audio device, a music player, a signal processing circuit, an information processing circuit, an information storage circuit, or components of any of these devices and others. Further examples of circuit elements 20 comprise circuits that control a charging or discharging process. For example, the circuit element 20 may be configured to control charging of the battery 2 so that charging is stopped before its complete storage capacity has been reached. The circuit elements 20 may be formed in the semiconductor substrate 1 or they may be formed in layers positioned over the semiconductor substrate. The battery 2 may be formed in the same semiconductor substrate 1. Alternatively, the battery 2 may be formed in a layer placed over the semiconductor substrate 1. An element separation trench 30 may be formed between the battery 2 and the circuit element 20 in order to prevent diffusion of lithium atoms to the integrated circuit 3. The element separation trench 30 may be filled with the materials of the passivation layer 10 as mentioned hereinbefore. Depending on the manufacturing method employed, the passivation layer 10 and the element separation trench 30 of the integrated circuit 36 may be made of the same layers.

FIG. 2B shows a top view of the integrated circuit 36 shown in FIG. 2A. The battery 2 is enclosed by an element separation trench 30 which may be filled with silicon oxide and/or silicon nitride. In the peripheral portion of the die, integrated circuits 3 are illustrated. As is clearly to be understood, FIG. 2B shows only an example of an arrangement and further suitable arrangements are easily conceivable. According to an embodiment, a sensor or another component utilizing energy may be implemented by one integrated circuit 3. Further, an energy harvester may be implemented by another integrated circuit 3. With this configuration, electrical energy for driving the sensor may be generated and stored in the integrated circuit 36. A kerf 35 may be disposed at the edge of the integrated circuit 36. Several of these integrated circuits 36 may be connected in series. Soldering pads may be disposed outside the housing of the integrated circuit 36.

Figure 3:
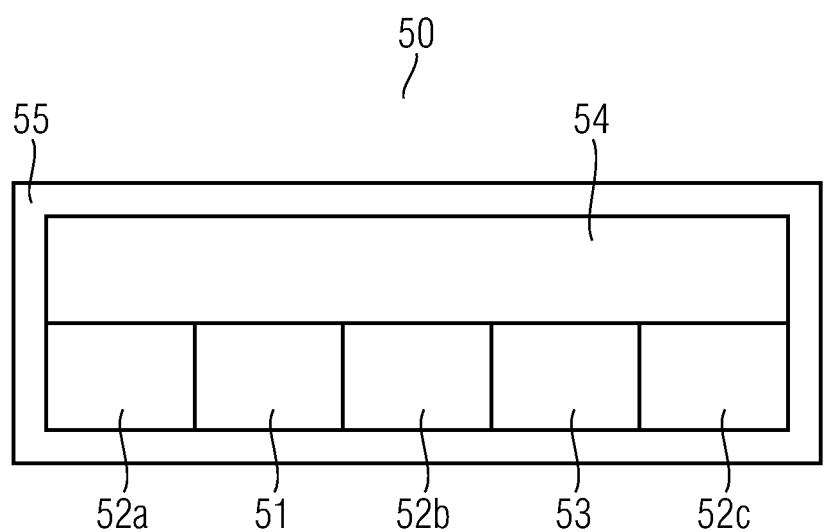
FIG. 3 shows an electronic device according to an embodiment.

FIG. 3 shows an embodiment of an electronic device 50, in which several chips are arranged within one layer and housed by one housing 55. In other words, according to this configuration, several components including the battery are packaged by a common package. However, they are not monolithically integrated. As is shown, on a side of a carrier substrate 54, several chips, for example, comprising a battery substrate 51 in which a battery as has been shown in FIGS. 1A or 1B is disposed and an integrated circuit (IC) substrate 53 may be arranged. Intermediate elements 52a, 52b, 52c which may comprise, for example, an insulating material such as a polymer, a ceramic or others may be disposed between the battery substrate 51 and the IC substrate 53. Circuit elements 20 as have been described above with reference to FIG. 2A may be disposed within the IC substrate 53. The battery substrate 51 and the IC substrate 53 are physically connected with each other by means of the carrier substrate 54. Further, conductive lines may be disposed within the carrier substrate 54 so as to enable an electrical contact between these components. For example, the carrier substrate 54 may be made of any suitable substrate material or of an insulating substrate material such as a ceramic, a polymer and others. A thickness of the carrier substrate 54 may be 20 to 100 µm. A thickness of the battery substrate 51 and the IC substrate 53 may be approximately 200 µm. The size of the electronic device 50 shown in FIG. 3 may, for example, be approximately similar to the size of a semiconductor chip, in the range of 1×1 mm$^2$ to several hundred mm$^2$, for example, 4×4 mm$^2$ or 5×5 mm$^2$. Typical storage capacities of such a battery having a size of 4×4 mm$^2$ may be in the order of about 10 mAh. According to an embodiment, a sensor or another component utilizing energy may be disposed in the IC substrate 53, whereas a battery is disposed in the battery substrate 51 and an energy harvester is disposed in the IC substrate 53 or a further integrated circuit substrate. With this configuration, electrical energy for driving the sensor may be generated and stored in the electronic device 50 which also includes the sensor.

Figure 4:
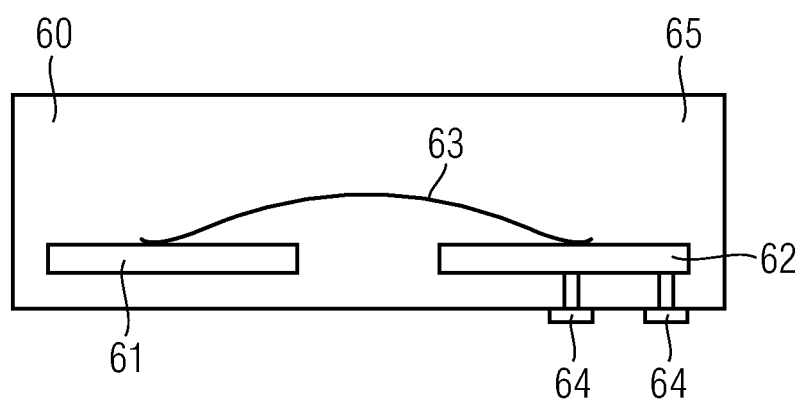
FIG. 4 shows an electronic device according to an embodiment.

FIG. 4 shows a further example of an electronic device 60. The electronic device 60 comprises a first substrate 61 and a second substrate 62. A battery as has been described above with respect to FIG. 1A or 1B is disposed within the first substrate 61. Electric circuits, for example, integrated circuits comprising circuit elements 20 as have been described above with reference to FIG. 2A may be disposed within the second substrate 62. In addition, such components or circuit elements may also be disposed within the first substrate 61. For example, some electric circuits may be disposed within the first substrate 61 and additional integrated circuits or circuit elements may be disposed within the second substrate 62. The first and second substrates 61, 62 may be disposed in one layer. Nevertheless, they may as well be disposed in different layers. For example, they may be stacked. The first and second substrates 61, 62 may have the same or different sizes. The first and second substrates and/or elements of the first and second substrates 61, 62 may be interconnected by means of one or more contact wires 63. They may be housed by a housing 65. Further, the components inside the housing 65 of the electronic device 60 may be accessible via contacts 64. The specific arrangement of the components within the electronic device 60 may, for example, depend on the specific conditions for use and the specific implementations of the electronic device 60. According to an embodiment, a battery is disposed in the first substrate 61, a sensor or another component utilizing energy may be disposed in the second substrate 62, and an energy harvester may be disposed in the first or the second substrate 61, 62. With this configuration, electrical energy for driving the sensor may be generated and stored in the electronic device 60 which also includes the sensor. A typical size of the electronic device 60 is about 1×1 to several 100 mm$^2$, for example less than 10×10 mm$^2$.

Figure 5:
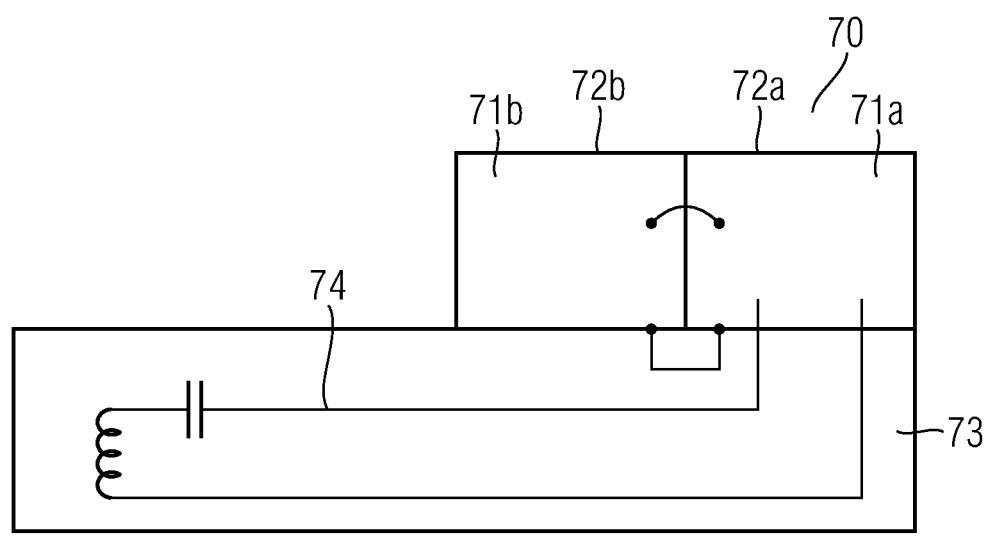
FIG. 5 shows an electronic device according to an embodiment.

FIG. 5 shows a further embodiment of an electronic device 70. The electronic device 70 comprises a first battery 71a and, optionally, a second battery 71b. As is clearly to be understood, the electronic device 70 may comprise more than two batteries. The first and the second batteries 71a, 71b are housed by separate housings 72a, 72b. Further, the first and second batteries 71a, 71b are connected with each other. The electronic device 70 further comprises an electronic component 74 which is housed by a separate housing 73. Examples of the electronic component 74 comprise any kinds of electric devices or circuit elements 20 as mentioned above. Further examples of the electronic component 74 comprise a computer, for example, a personal computer, or a notebook, a server, a router, a game console, for example, a video game console, as a further example, a portable video game console, a graphics card, a personal digital assistant, a digital camera, a cell phone, an audio system such as any kind of music player, a video system or a transportation device such as a car, a motorbike, a personal transporter or any kind of appliance that may be battery-driven. Further examples of electronic devices that may be battery-driven are easily conceivable to the person skilled in the art. For example, the electronic device 74 may be a portable or a non-portable electronic device. According to the arrangement shown in FIG. 5, the batteries 71a, 71b as well as the electronic component 74 are separately housed and may be assembled so as to form a functionable electronic device 70. A typical size of the electronic device 70 is, for example, in the range of 1×1 to several hundred mm$^2$.

FIGS. 6 to 10 illustrate an example of a process of manufacturing the battery and/or an integrated circuit.

The process described in the following uses several methods that are well known in semiconductor technology. Accordingly, any of the steps performed with respect to the manufacturing of the battery can as well be used for processing an integrated circuit that may be formed on the same chip. The example shown in FIGS. 6 to 10 illustrates the steps of manufacturing the battery elements only. Nevertheless, as is clearly to be understood, the employed processes or a part of them may as well be used for processing the circuit elements, although not being explicitly shown in the drawings.

Figure 6A:
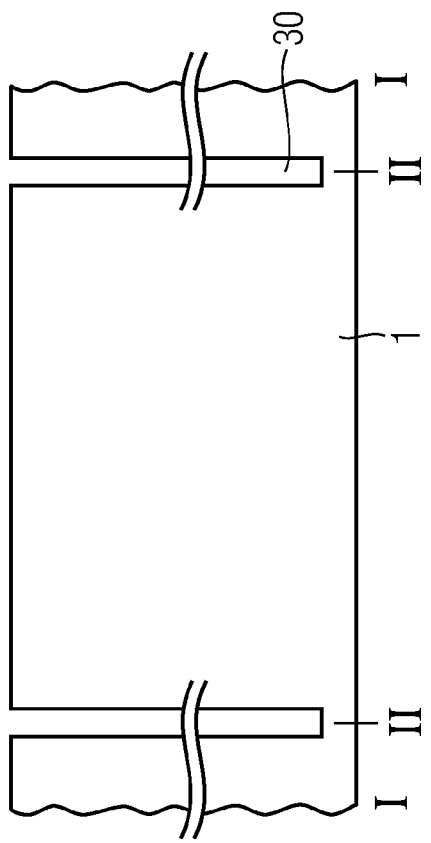

FIG. 6A shows a cross-sectional view of a portion of a carrier, and FIG. 6B shows a plan view of the carrier. The cross-sectional view of FIG. 6A is taken between I and I as shown in FIG. 6B. In the following Figures, also cross-sectional views between II and II are shown as is illustrated in FIGS. 6A and 6B. Separation trenches 30 are formed in the carrier. The separation trenches extend to such a large depth into the carrier that the back side of the carrier may be thinned in a later processing step so as to isolate neighboring batteries from each other using the separation trenches 30. The separation trenches are formed using generally known processing methods including lithographic methods for defining the position of the separation trenches and etching by known processes including dry-etching or wet-etching as is generally known in the art of semiconductor processing. FIG. 6B shows an example of a plan view. As is shown in FIG. 6B the separation trench encloses a central portion of the carrier portion 1. Although the shown separation trench 30 has a rectangular shape any other shape can be taken. In particular, the separation trenches may be formed as vertical and horizontal continuous lines so as to form a mesh. The width of each of the separation trenches 30 may be chosen so that the separation trenches 30 may be suitable filled with the material forming the diffusion barrier as will be described later.

Thereafter, a groove 31 may be formed in the surface of the carrier 1. The groove 31 may be formed by generally known etching methods, for example wet-chemical etching using KOH for providing inclined side surfaces of the groove depending on the crystal direction if a carrier of monocrystalline silicon is used. Nevertheless, as is clearly to be understood alternative etching methods may be employed. The depth of the groove 31 may be selected so as to achieve a desired storage capacity of the battery. The bottom side of the groove 31 forms the active silicon surface. FIG. 7A shows a cross-sectional view of the die between I and I after forming the groove 31, FIG. 7B shows a plan view of the die.

Figure 8:
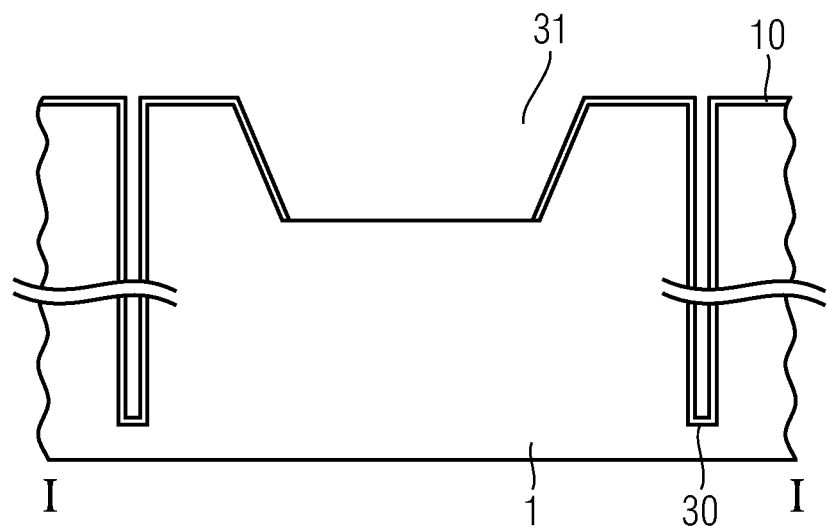
FIG. 8 shows a cross-sectional view of a carrier after performing a further processing step.

A passivation layer 10 which may have the function of a diffusion barrier is formed over the surface of the carrier, while leaving the bottom side of the groove 31 uncovered. The passivation layer 10 may comprise silicon oxide ($SiO_2$) and/or silicon nitride ($Si_3N_4$), polymers, imids, spin-on-glass (SOG), polyethylene or any combination of these materials. Further examples comprise metals or combinations of metals and the materials mentioned above. During the deposition of the passivation layer 10, the bottom side of the groove 31 may be masked by a suitable material so as to prevent the deposition of the passivation layer 10. The layer thickness may be adjusted to form a conformal liner or a filling in the separation trenches 30. For example, if the separation trenches 30 are to be used for isolating single batteries in a later processing step, the passivation layer 10 can form a conformal liner. If, on the other hand, the separation trenches 30 are to be used as an element isolation trench in a later processing step, the passivation layer 10 can form a filling. FIG. 8 shows a cross-sectional view of an example after forming the passivation layer 10 as a conformal liner.

Figure 9:
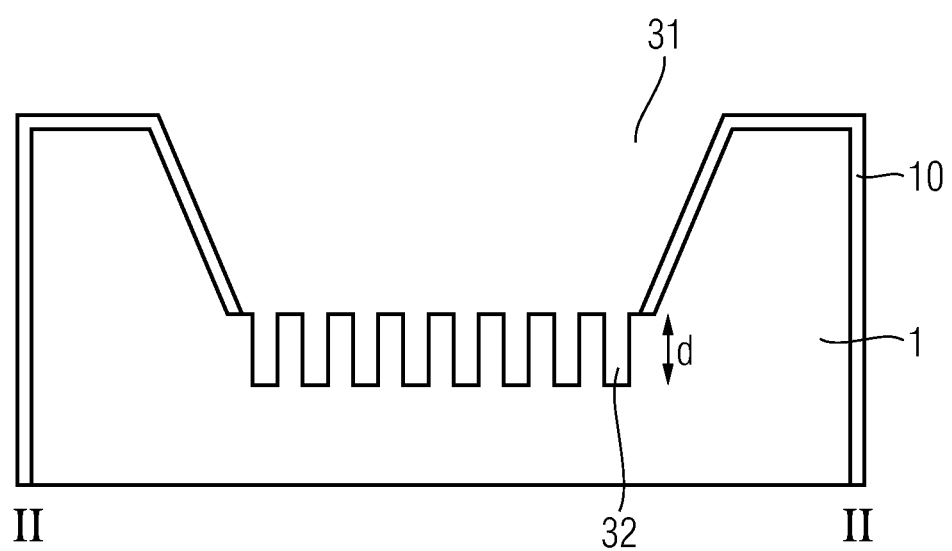
FIG. 9 shows a cross-sectional view of an example of a carrier including a groove.

Then, optionally, processing to form a three-dimensional structure in the active surface may be performed so as to increase its surface area. This processing may comprise lithographic methods and patterning by etching processes, performing electrochemical processes, wet-chemical processes, forming a native high temperature structure by using a suitable deposition process. Thereby, the insertion of Li ions is facilitated and the mechanical expansion of the anode material due to the insertion of lithium is compensated. For example, trenches, pyramids, columns and others may be formed on the bottom side of the groove 31. For example, these steps may be performed using the passivation layer 10 as a mask. FIG. 9 shows trench structures 32 vertically extending from the bottom side of the groove 31. The trench structures 32 may have a depth d measured from the planar bottom side of the groove 31 of about 20 to 700 μm. Nevertheless, additionally sub-structures may be formed in the trench structures 32. For example, horizontally extending sub-structures may be formed in each of the trench structures 32. As a further example, mesopores or others may be formed in the trench structures 32 so as to enhance the surface area thereof.

Thereafter, a thin metal layer 11 is formed over the exposed silicon material forming the anode. The metal layer 11 may have a thickness about 10 to 100 nm. The material may comprise metals such as Ag, Al, Au, Pd or Pt, which have the possibilities of forming an alloy with lithium. Further examples comprise Zn, Cd, Hg, B, Ga, En, Th, C, Si, Ge, Sn, Pb, As, Sb, Be, Se, Te. The metal layer 11 may be formed by sputtering or by any other deposition process as is generally known. Thereafter, the separator or separators stack 18 is formed in the groove 31. The separator or separator stack 18 may be formed by the methods that are generally known. Then, the electrolyte material 12 is filled into the groove 31. This may also be accomplished by generally known methods.

Figure 10:
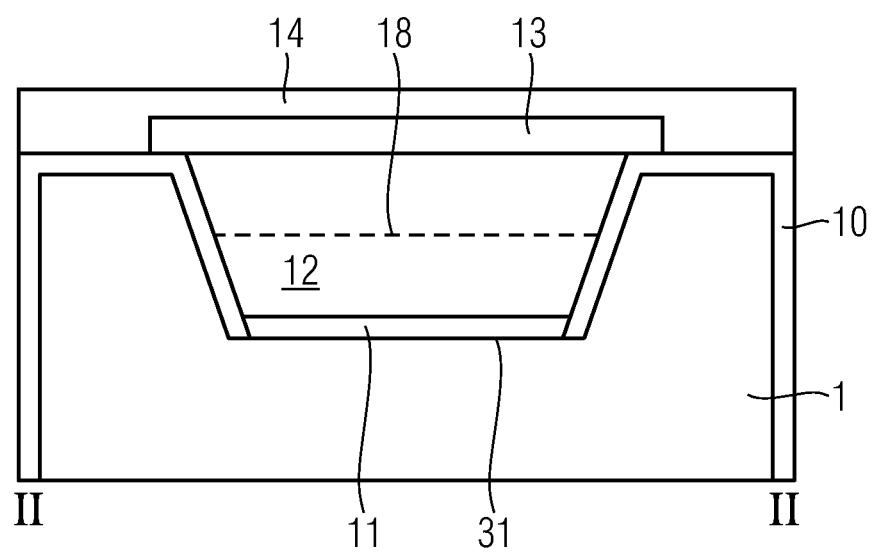
FIG. 10 shows a cross-sectional view of a carrier after performing a further processing step.

Thereafter, the cathode 13 is arranged over the groove 31. Materials of the cathode 13 may comprise the examples as mentioned above. The cathode 13 may be formed by generally known methods. Finally, the sealant material 14 is formed over the surface of the cathode 13. Thereafter, the die will be thinned from the back side. For example, this may be accomplished by chemical mechanical polishing (CMP) or etching. Due to this thinning step, the single batteries can be isolated. However, alternative methods of isolation of the elements as e.g. sawing or laser cutting are possible. FIG. 10 shows an example of a cross-sectional view after isolation of the batteries.

Then the back side metallization is formed on the back side of the carrier 1. For example, first an interfacial layer 15 of TiW may be formed by known methods, followed by a metal layer 16 such as copper or any other suitable conductive material. The metal layer 16 may have a thickness of 500 nm to 50 μm.

Thereafter, the metal layer 16 may be patterned so as to form conductive lines for discharging the current produced by the battery.

Although steps for manufacturing a battery have been shown in FIGS. 6 to 10, it is clearly to be understood that the method can be modified so that an integrated circuit as shown in FIG. 2 can be manufactured. For example, for manufacturing an integrated circuit comprising a circuit formed in a semiconductor substrate and a lithium battery, the element separation trenches 30 (cf. FIG. 2A) can be formed so as to have a width so that in the step of forming the passivation layer a filling is formed.

Figure 11:
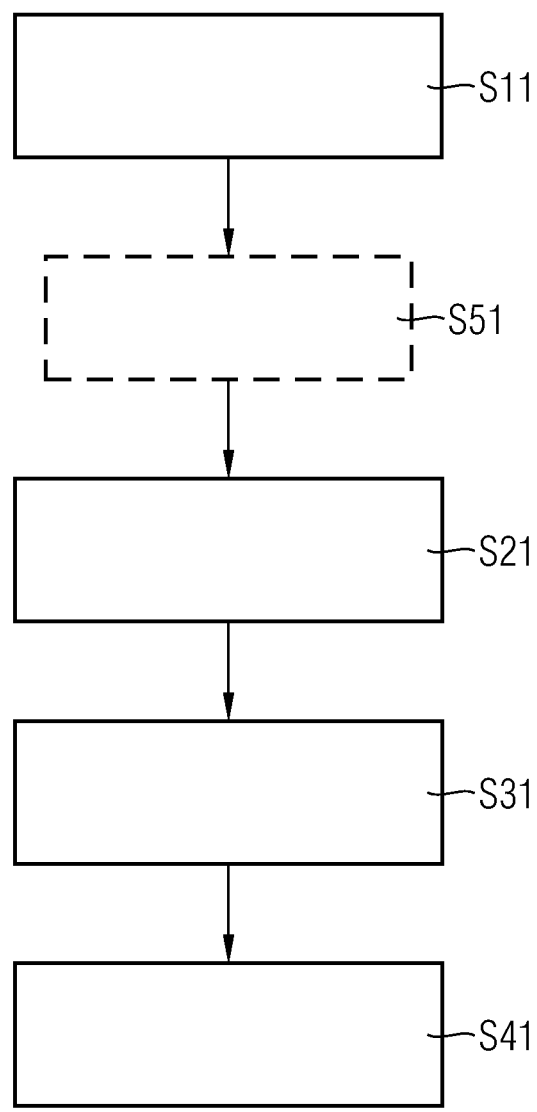
FIG. 11 schematically illustrates a method of forming a lithium battery.

FIG. 11 shows a flow diagram illustrating an example of a method of forming a battery. As is shown, the method comprises forming an anode on a surface of a substrate (S11), forming a separator element (S21), forming a cathode (S31) so that the separator element is disposed between the cathode and the anode and filling an electrolyte in a space formed by the anode, the cathode and the substrate (S41). For example, forming the anode may comprise patterning a surface of the substrate by forming a groove in the substrate, wherein a wall of the groove forms the anode. The method may further comprise forming a layer including a metal over at least a portion of the silicon body (S51).

Figure 12:
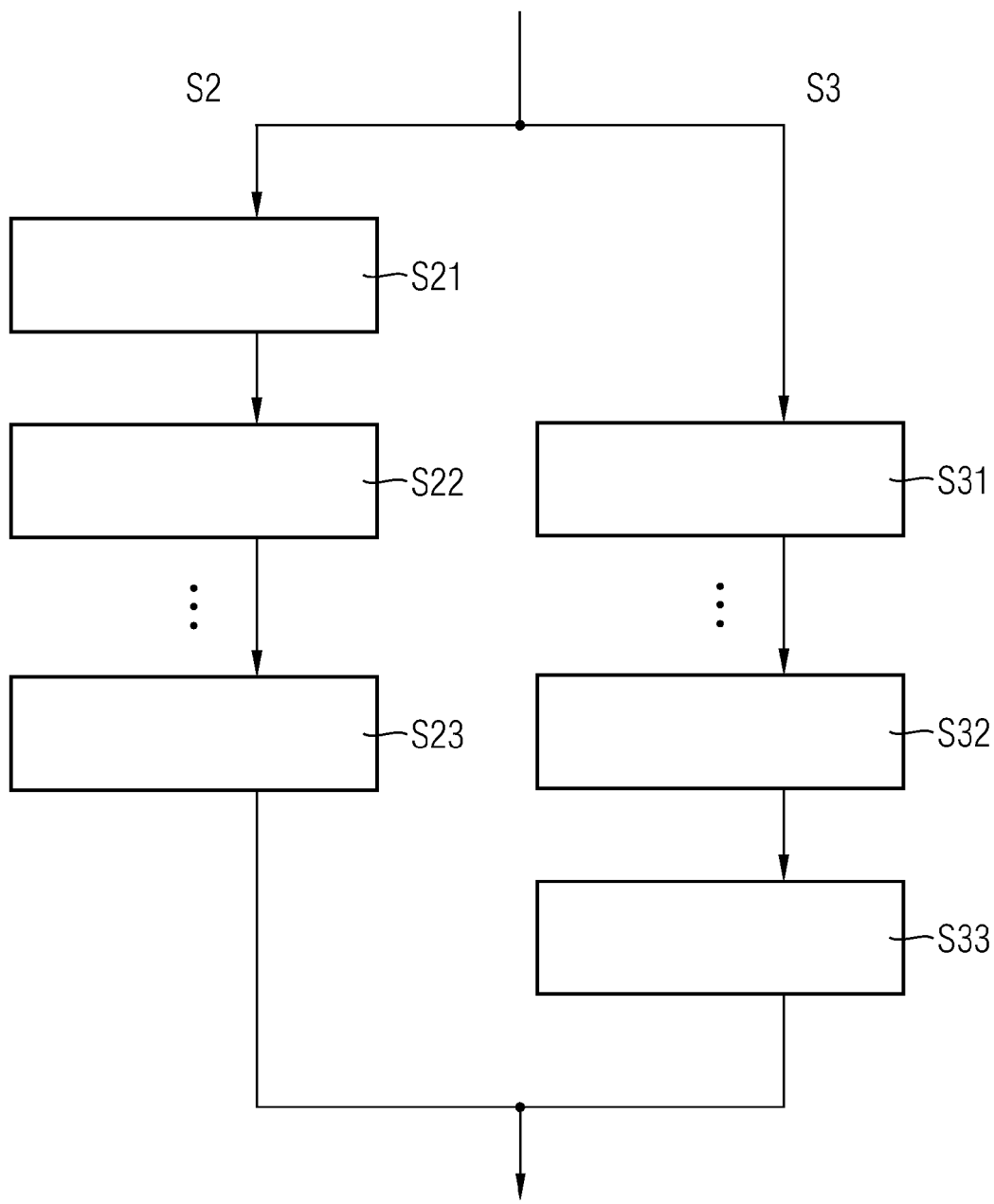
FIG. 12 schematically illustrates a method of manufacturing an integrated circuit.

FIG. 12 illustrates a method of manufacturing an integrated circuit. As is shown, the method may comprise forming circuit elements in a semiconductor substrate (S2, S21, S22, S23) and forming a lithium battery (S3), wherein forming a lithium battery comprises forming an anode on a surface of the semiconductor substrate or in a semiconductor layer over the semiconductor substrate (S31, S32, S33). Forming the circuit elements (S21, S22, S23) in the semiconductor substrate and forming a lithium battery (S31, S32, S33) may comprise common processing steps. For example, the respective methods may comprise common and non-common processing steps. Accordingly, some of the processing steps are performed subsequently, while other processing steps are performed concurrently.

Figure 13:
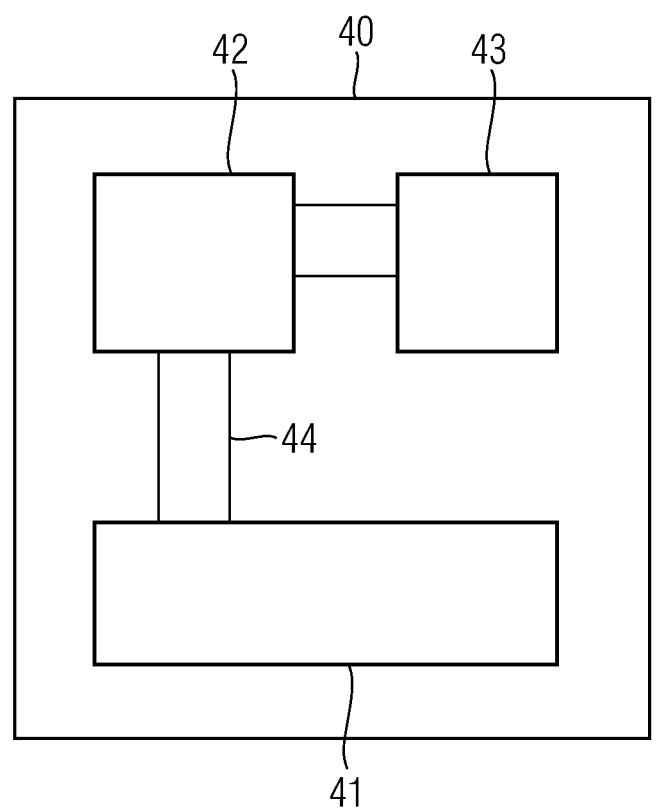
FIG. 13 shows an example of an electronic device including a battery.

FIG. 13 schematically shows an electronic device 40 according to an embodiment. As is shown in FIG. 13, the electronic device 40 may comprise an electric circuit 41, and a battery 42. The battery 42 may be a battery as has been described hereinabove, for example with reference to FIGS. 1A and 1B. According to a further embodiment, the battery 42 may be an integrated circuit as has been described with reference to FIGS. 2A and 2B, for example. To be more specific, the battery 42 may additionally comprise circuit elements 20 as is shown in FIG. 2A. Alternatively, the battery 42 and the electric circuit 41 may be implemented on separate chips or dies as has been explained above with respect to FIGS. 3 and 4. When the battery 42 and the electric circuit 41 are disposed on separate chips, the battery 42 may be connected with the electric circuit 41 via an interconnection 44. The electric circuit 41 may comprise a processing device for processing data. The electric circuit 41 may further comprise one or more display devices for displaying data. The electric circuit 41 may further comprise a transmitter for transmitting data. The electronic device 40 may further comprise components which are configured to implement a specific electronic system. According to an embodiment, the electronic device 40 may further comprise an energy harvesting device 43 that may deliver electrical energy to the battery 42, the energy having been generated from solar, thermal, kinetic or other kinds of energy. For example, the electronic device 40 may be a sensor such as a tire pressure sensor, wherein the electric circuit 41 further comprises sensor circuitry and, optionally, a transmitter that transmits sensed data to an external receiver. According to another embodiment, the electronic device 40 may be an actuator, an RFID tag or a smartcard. For example, a smartcard may additionally comprise a fingerprint sensor, which may be operated using energy delivered by the battery 42.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A lithium battery, comprising:
   a cathode;
   an anode integrally formed within a silicon substrate, wherein a surface portion of the silicon substrate is patterned to form a plurality of sub-structures; and
   an electrolyte.

2. The lithium battery of claim 1, wherein a groove is formed in the substrate, and the anode and the electrolyte are arranged in the groove.

3. The lithium battery of claim 1, wherein the sub-structures are three-dimensional.

4. The lithium battery of claim 1, wherein the sub-structures comprise mesopores.

5. The lithium battery of claim 1, wherein the surface portion of the silicon substrate is patterned to form a plurality of grooves or columns.

6. The lithium battery of claim 5, wherein a surface of the grooves or columns is patterned to form a plurality of further sub-structures.

7. The lithium battery of claim 6, wherein the further sub-structures comprise mesopores.

8. An integrated circuit, comprising the lithium battery of claim 1 and a circuit element.

9. The integrated circuit of claim 8, wherein the circuit element is formed in the silicon substrate.

10. The integrated circuit of claim 8, wherein the circuit element is formed in a further semiconductor substrate separate from the silicon substrate.

11. The integrated circuit of claim 8, wherein the circuit element is selected from the group consisting of an energy receiving device, an energy emitting device, a signal processing circuit, an information processing circuit, an information storing circuit, a transistor, a capacitor, a resistor, a MEMS (micro-electro-mechanical system) device, a sensor, an actuator, an energy harvester, a device for converting energy, a display device, a video device, an audio device, a music player and components of any of the devices.

12. An electronic device, comprising the integrated circuit of claim 8.

13. The electronic device of claim 12, wherein the electronic device is selected from the group consisting of a sensor, an actuator, an RFID (radio frequency identification device) tag and a smartcard.

14. The electronic device of claim 12, further comprising an electric circuit.

15. A method of manufacturing a lithium battery, the method comprising:
    patterning a surface portion of a silicon substrate to form a plurality of sub-structures;
    forming an anode integrally within the silicon substrate in the patterned surface portion;
    forming a cathode so that a cavity is formed between the cathode and the anode; and
    filling an electrolyte in the cavity.

16. The method of claim 15, further comprising forming a groove in the substrate.

17. The method of claim 15, wherein forming the sub-structures comprises forming mesopores.

18. The method of claim 15, wherein forming the sub-structures comprises forming a plurality of grooves or columns.

* * * * *